(12) United States Patent
Gubbens (10) Patent No.: US 7,755,043 B1
(45) Date of Patent: Jul. 13, 2010

(54) BRIGHT-FIELD/DARK-FIELD DETECTOR WITH INTEGRATED ELECTRON ENERGY SPECTROMETER

(75) Inventor: Alexander J. Gubbens, Redwood City, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 552 days.

(21) Appl. No.: 11/888,380

(22) Filed: Jul. 31, 2007

Related U.S. Application Data (60) Provisional application No. 60/919,440, filed on Mar. 21, 2007.

(51) Int. Cl.
*G01N 23/00* (2006.01)
(52) U.S. Cl. .................. 250/307; 250/306; 250/310; 250/311
(58) Field of Classification Search .......... 250/306, 250/307, 310, 311, 397
See application file for complete search history.

(56) References Cited

U.S. PATENT DOCUMENTS

| | | | |
|---|---|---|---|
| 4,945,237 A | 7/1990 | Shii et al. | |
| 5,650,621 A | 7/1997 | Tsuneta et al. | |
| 6,621,082 B2 | 9/2003 | Morita et al. | |
| 6,815,678 B2 | 11/2004 | Golla-Schindler et al. | |
| 7,105,816 B2 | 9/2006 | Kamiya et al. | |
| 7,285,780 B2 | 10/2007 | Jaksch et al. | |

*Primary Examiner*—Nikita Wells
*Assistant Examiner*—Johnnie L Smith
(74) *Attorney, Agent, or Firm*—Okamoto & Benedicto LLP (57) ABSTRACT

One embodiment relates to an electron beam apparatus including an electron beam column, an immersion objective lens, a Wien filter, a bright-field/dark-field detector, and an electron energy spectrometer. The bright-field/dark-field detector comprising an opening configured to pass through bright field secondary electrons and one or more detector segments around the opening configured to detect dark field secondary electrons. The electron energy spectrometer configured to detect the bright field secondary electrons passed through the opening and to measure an energy spectrum of the bright field secondary electrons. Other embodiments, aspects and features are also disclosed.

22 Claims, 6 Drawing Sheets

BRIGHT-FIELD/DARK-FIELD DETECTOR WITH INTEGRATED ELECTRON ENERGY SPECTROMETER

CROSS-REFERENCE TO RELATED APPLICATION

The present application claims the benefit of U.S. Provisional Patent Application No. 60/919,440, entitled "Bright-Field/Dark-Field Detector With Integrated Electron Energy Spectrometer", filed Mar. 21, 2007, by inventor Alexander J. Gubbens, the disclosure of which is hereby incorporated by reference in its entirety.

BACKGROUND OF THE INVENTION

1. Field of the Invention

The present disclosure relates to electron detectors and electron beam apparatus.

2. Description of the Background Art

Scanning electron microscope (SEM) instruments may utilize bright-field and dark-field detectors to enhance the contrast of the defects of interest in the image.

A bright-field detector detects those secondary electrons that are emitted from the sample at relatively low polar angles relative to the normal to the surface. A typical upper limit for the polar angle relative to the surface normal for bright-field electrons may be considered to be forty-five (45) degrees, for example. An image formed using the signal from a bright-field detector (i.e. a bright-field image) is similar in appearance to that of a standard top-down image, such as that obtained by a critical dimension SEM (CD-SEM), for example.

A dark-field detector is to detect those secondary electrons that are emitted from the sample at relatively high polar angles relative to the normal to the surface. A typical lower limit for the polar angle relative to the surface normal for dark-field electrons may be considered to be forty-five degrees, for example. An image formed using the signal from a dark-field detector (i.e. a dark-field image) gives the appearance of being illuminated from a side angle and shows enhanced edge contrast. Small particles, scratches, dents, or bumps that are not at all or hardly visible in the regular or bright-field image, tend to show clearly in the dark-field image. Multiple dark-field detectors may be used to allow one to view the sample at different apparent directions of illumination so as to more clearly highlight the features of interest.

It is highly desirable to improve SEM instrumentation. More particularly, it is highly desirable to improve bright-field and dark-field capabilities of SEM instrumentation.

SUMMARY

One embodiment relates to an electron beam apparatus including an electron beam column, an immersion objective lens, a Wien filter, a bright-field/dark-field detector, and an electron energy spectrometer. The bright-field/dark-field detector comprising an opening configured to pass through bright field secondary electrons and one or more detector segments around the opening configured to detect dark field secondary electrons. The electron energy spectrometer configured to detect the bright field secondary electrons passed through the opening and to measure an energy spectrum of the bright field secondary electrons.

Another embodiment relates to a method of electron beam imaging and spectrometry. A secondary electron beam is deflected away from the optical axis, and an energy dispersion is introduced in the deflected secondary electron beam. The method includes detecting dark field secondary electrons detected while bright field secondary electrons are passed through an opening. The bright field secondary electrons passed through the opening are subsequently detected, for example, by an electron energy spectrometer.

Another embodiment relates to a method of electron beam imaging and spectrometry. A primary electron beam is generated along an optical axis of an electron beam column and focused onto the substrate sample. The secondary electron beam away from the optical, and an energy dispersion is introduced in the deflected secondary electron beam, wherein said deflecting alternates rapidly between a first off-axis direction or a second off-axis direction. Bright-field and dark-field secondary electrons are detected when the secondary electron beam is deflected in the first off-axis direction, and an electron energy spectrum is detected when the secondary electron beam is deflected in the second off-axis direction.

Other embodiments, aspects and features are also disclosed.

DETAILED DESCRIPTION

As discussed above, SEM instruments may utilize bright-field and dark-field detectors to enhance the contrast of the defects of interest in the image, and it is highly desirable to improve bright-field and dark-field imaging capabilities of SEM instrumentation. In addition, it is highly desirable to provide electron energy spectrometry capabilities in addition to bright-field and dark-field imaging.

Attempts have been previously made to provide a dark field detection system for an SEM with an immersion objective lens. Using an immersion objective lens has the advantage of potentially providing higher resolution. Unfortunately, immersion objective lens technology generally interferes with the collection efficiency of below-the-lens dark-field detectors (i.e. side detectors positioned below the objective lens). The interference occurs is because of the high magnetic field between the immersion objective lens and the sample.

Therefore, non-immersion objective lens designs have been commonly used for previous SEMs with dark-field imaging capabilities. Unfortunately, non-immersion objective lenses typically result in higher lens aberration coefficients and leading to inferior image resolution.

The present disclosure uses an immersion objective lens to reduce lens aberrations and provide superior image resolution. In addition, the high magnetic field between the immersion objective lens and the sample is avoided by utilizing behind-the-lens dark-field detectors (i.e. detectors on the other side of the objective lens from the sample). However, with such a behind-the-lens configuration, there is an issue as to how to enable the detection of both a bright-field/dark-field imaging signal and an electron energy spectrum signal.

One approach to detect both a bright-field/dark-field imaging signal and an energy spectrum involves controllably deflecting the secondary electrons to a bright-field/dark-field detector to obtain the imaging signal, or an electron energy spectrometer to obtain the energy spectrum. This approach is illustrated in FIGS. 1A and 1B.

Figure 1A:
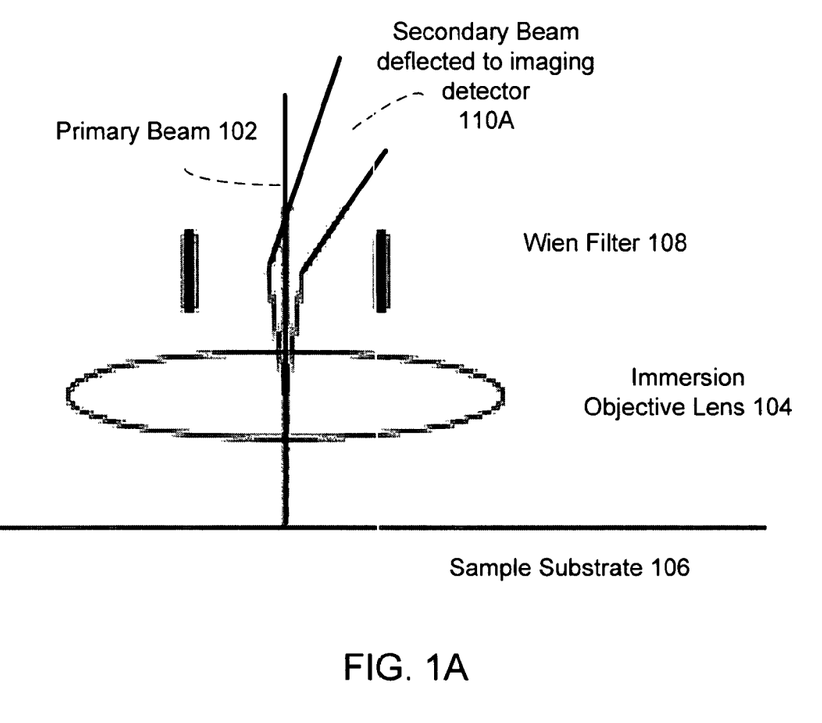
FIG. 1A is a schematic diagram showing a Wien filter with a first polarity so as to deflect the secondary electron beam to an imaging detector in accordance with an embodiment of the invention.
Figure 1B:
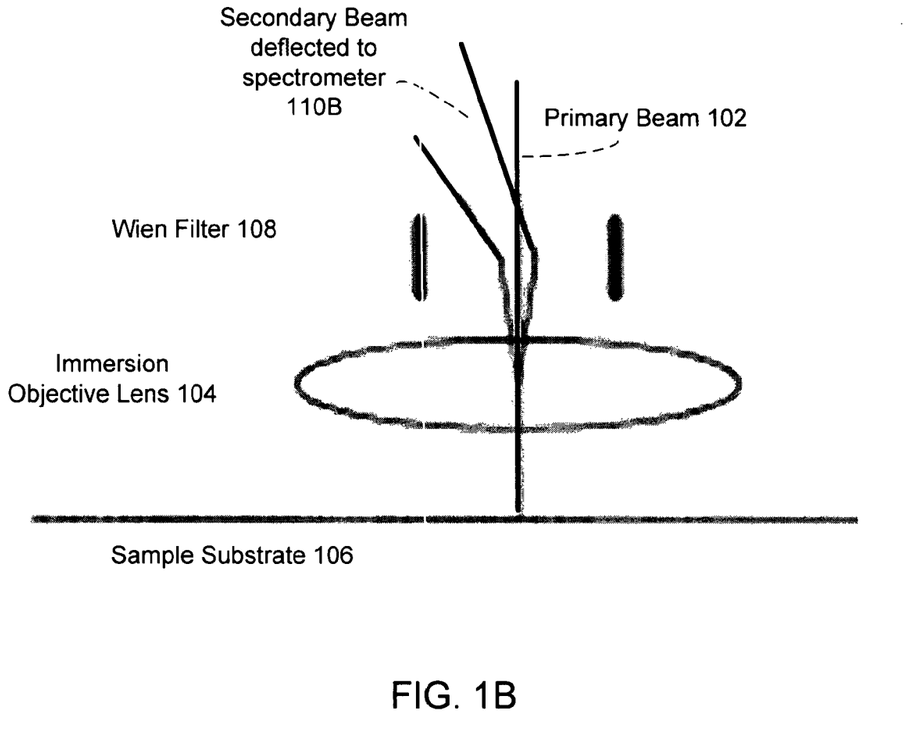
FIG. 1B is a schematic diagram showing the Wien filter with a second polarity so as to deflect the secondary electron beam to a spectrometer in accordance with an embodiment of the invention.

In both FIGS. 1A and 1B, a primary beam 102 is shown on a trajectory down the optical axis of the electron beam column, being focused by the immersion objective lens 104, and impinging upon the sample substrate 106. Secondary electrons are emitted from the sample substrate 106 so as to form a secondary electron beam 110. The secondary electron beam 110 (which may include both secondary electrons and backscattered electrons) goes on a trajectory back through the objective lens 104 and is deflected by the Wien filter 108.

FIG. 1A is a schematic diagram showing a Wien filter 108 with a first polarity so as to deflect the secondary electron beam 110A to a bright-field/dark-field imaging detector (not shown) in accordance with an embodiment of the invention. In contrast, FIG. 1B is a schematic diagram showing the Wien filter 108 with a second polarity so as to deflect the secondary electron beam 110B to an energy spectrometer in accordance with an embodiment of the invention. Hence, with such a system, the secondary electron beam 110 may be controllably deflected so as to be detected by either an imaging detector or an energy spectrometer. The polarity switching between FIG. 1A and FIG. 1B may be performed rapidly so as to provide both bright-field/dark-field imaging and energy spectrometry to a user.

However, this approach raises concerns regarding hysteresis in the magnetic Wien filter elements, and the resulting potentially adverse effects on the primary electron beam and the resolution performance of the SEM. Moreover, this technique does not allow the simultaneous detection of the bright-field/dark-field imaging signal and the electron energy spectrum.

The present disclosure overcomes the aforementioned problems and disadvantages. As discussed in further detail below, the present disclosure provides for the simultaneous detection of the bright-field/dark-field imaging signal and the electron energy spectrum using an SEM immersion lens column.

Figure 2:
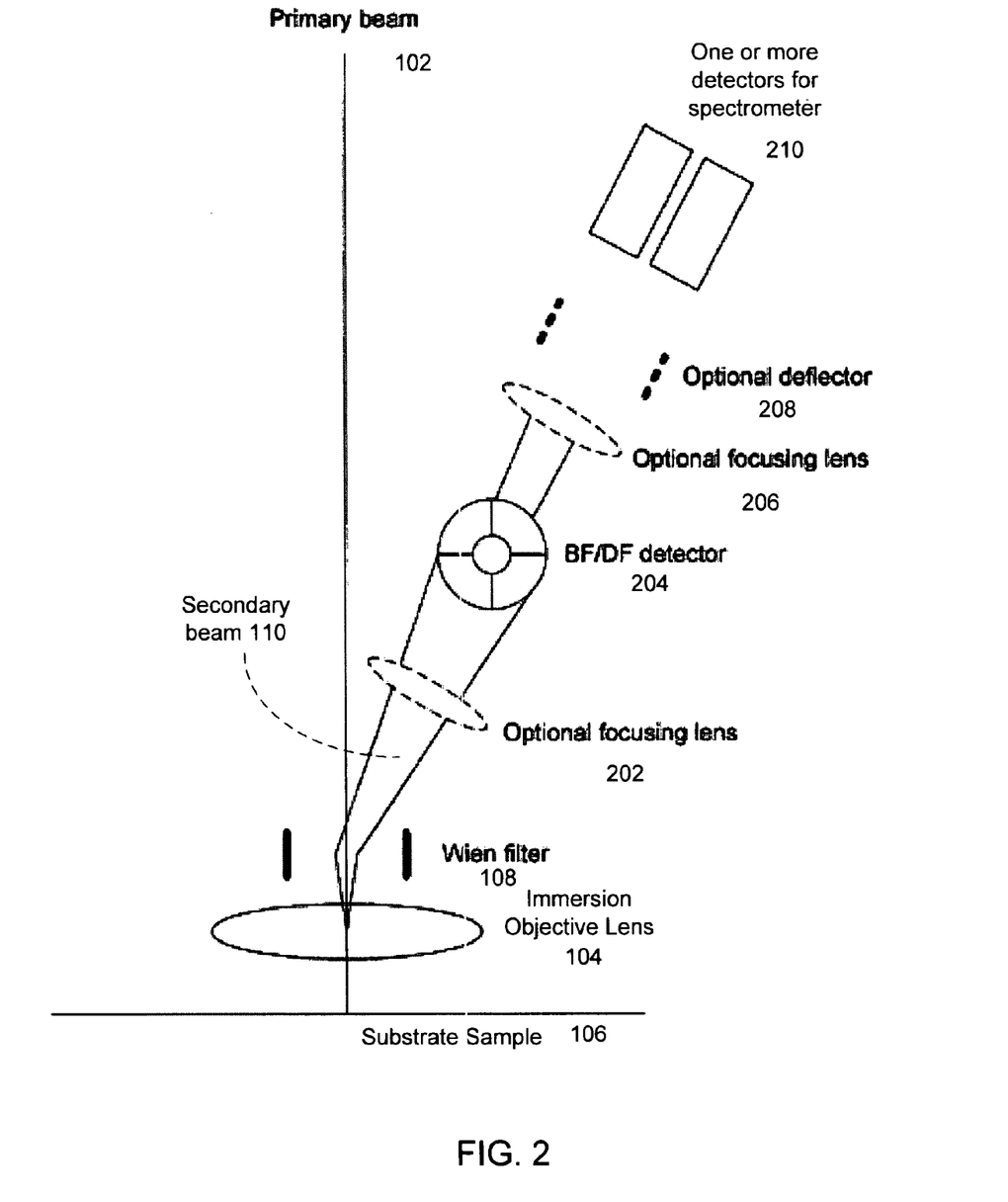
FIG. 2 is a schematic diagram of an electron beam apparatus including an off-axis bright-field/dark-field detector and electron energy spectrometer in accordance with an embodiment of the invention.

FIG. 2 is a schematic diagram of an electron beam apparatus including an off-axis bright-field/dark-field (BF/DF) detector 204 and electron energy spectrometer 210 in accordance with an embodiment of the invention.

The primary beam 102 is shown on a trajectory down the optical axis of the electron beam column, being focused by the immersion objective lens 104, and impinging upon the sample substrate 106. Secondary electrons are emitted from the sample substrate 106 so as to form a secondary electron beam 110. The secondary electron beam 110 (which may include both secondary electrons and backscattered electrons) goes on a trajectory back through the objective lens 104 and is deflected off the optical axis by the Wien filter 108. In addition to deflecting the secondary electron beam 110, the Wien filter 108 introduces a degree of energy dispersion into the secondary electron beam 110. This energy dispersion may be relatively small in magnitude (for example, on the order of microns per electron-volt) and normally may go unnoticed or be ignored.

Alternatively, other types of deflectors, electrostatic or magnetic, may be used instead of a Wien filter 108. These deflectors will also introduce a small amount of energy dispersion into the secondary electron beam 110. An advantage of the Wien filter 108 is that it allows the primary beam 102 to travel essentially undisturbed and hence allows for a more straightforward design.

The outer segments or channels of the BF/DF detector 204 are utilized for detecting the dark-field signals. However, in contrast to a conventional bright-field/dark-field detector, the center segment or channel of the bright-field/dark-field detector 204 is replaced by a bore opening. The bore opening enables the bright-field secondary electrons to pass through to the spectrometer 210.

An optional deflector 208 may also be used to focus and deflect to multiple detectors (not just the spectrometer) 210. For example, the multiple detectors 210 may include a single channel detector (e.g., a scintillator and photo-multiplier tube) for the detection of the bright-field image and a linear array detector (e.g., a scintillator and CCD or photodiode array) for detecting the energy spectrum. The optional focusing lenses before 202 or after 206 the BF/DF detector 204 may be adjusted depending on which detector is being used. Each focusing lens may comprise of a combination of round and multipole electron lenses, which may be electrostatic and/or magnetic. Quadrupole lenses may also be used to control x and y focus, and higher-order multipole lenses may be used to control aberrations.

The total spectrum intensity may be obtained from the spectrometer 210 for the formation of a "regular" bright-field image. Either simultaneously or separately, the location of the secondary electron peak (somewhere around a few electron-volts) may be detected as a direct measure of the local surface potential. This measurement may then be continuously fed back into the column control system to automatically maintain the image focus or to cancel any energy spectrum drift due to charging.

Figure 3:
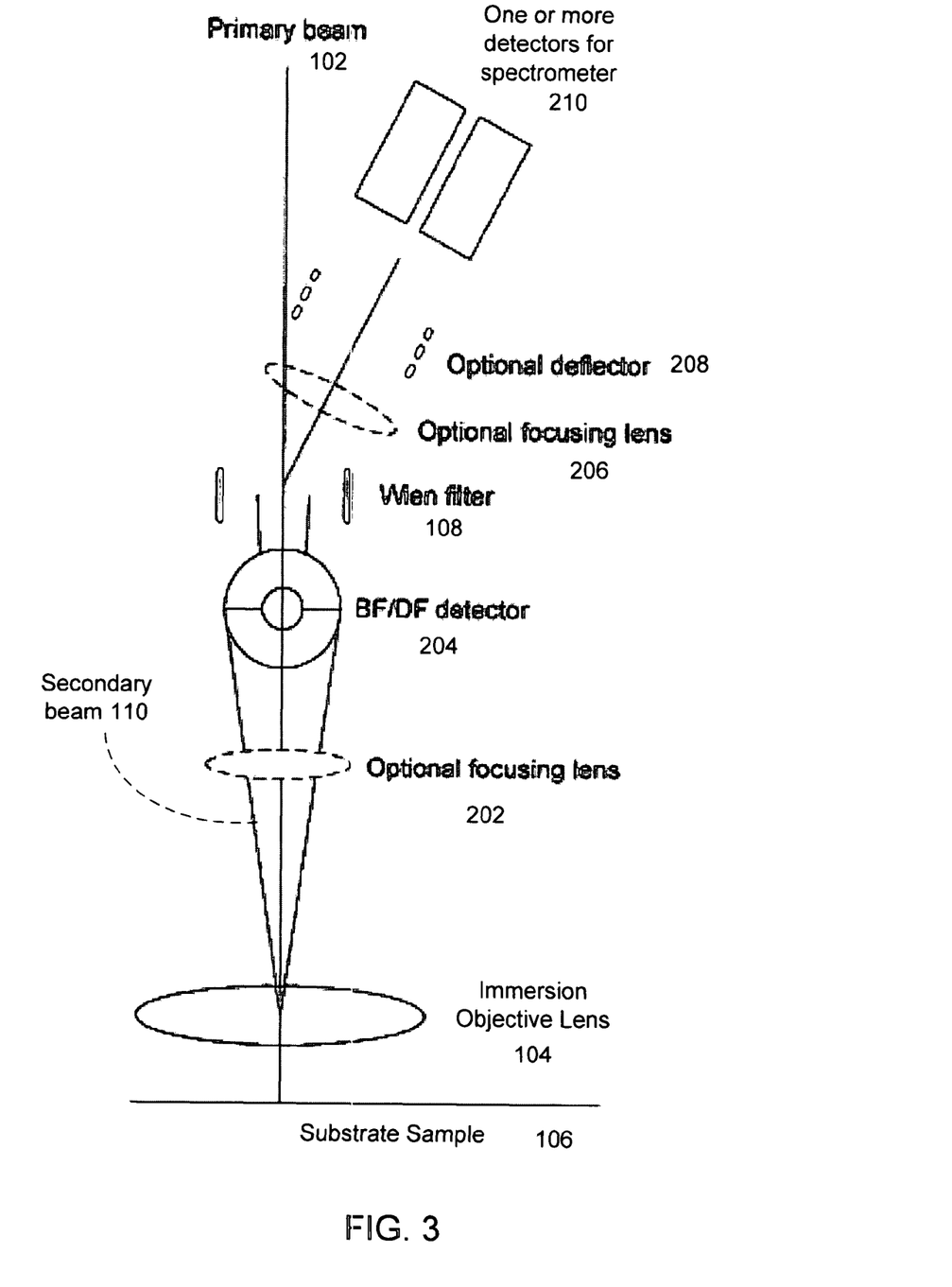
FIG. 3 is a schematic diagram of an electron beam apparatus including an on-axis bright-field/dark-field detector and electron energy spectrometer in accordance with an embodiment of the invention.

FIG. 3 is a schematic diagram of an electron beam apparatus including an on-axis bright-field/dark-field detector 204 and electron energy spectrometer 210 in accordance with an embodiment of the invention.

The primary beam 102 is shown on a trajectory down the optical axis of the electron beam column, being focused by the immersion objective lens 104, and impinging upon the sample substrate 106. Secondary electrons are emitted from the sample substrate 106 so as to form a secondary electron beam 110. The secondary electron beam 110 (which may include both secondary electrons and backscattered electrons) goes on a trajectory back through the objective lens 104.

In this embodiment, the BF/DF detector 204 is on the optical axis of the electron beam column, i.e. it is on-axis. As in the off-axis embodiment, the outer segments or channels of the BF/DF detector 204 are utilized for detecting the darkfield signals, and the center segment or channel of the BF/DF detector 204 is replaced by a bore opening. The bore opening enables the bright-field secondary electrons to pass through to the Wien filter 108.

These BF secondary electrons are deflected off the optical axis by the Wien filter 108. In addition to deflecting the secondary electron beam 110, the Wien filter 108 introduces a degree of energy dispersion into the secondary electron beam 110. This energy dispersion may be relatively small in magnitude (for example, on the order of microns per electron-volt) and normally may go unnoticed or be ignored.

An optional deflector 208 may also be used to focus and deflect to multiple detectors (not just the spectrometer) 210. For example, the multiple detectors 210 may include a single channel detector (e.g., a scintillator and photo-multiplier tube) for the detection of the bright-field image and a linear array detector (e.g., a scintillator and CCD or photodiode array) for detecting the energy spectrum. The optional focusing lenses before 202 or after 206 the BF/DF detector 204 may be adjusted depending on which detector is being used. Each focusing lens may comprise of a combination of round and multipole electron lenses, which may be electrostatic and/or magnetic. Quadrupole lenses may also be used to control x and y focus, and higher-order multipole lenses may be used to control aberrations.

Similar to the off-axis embodiment, the total spectrum intensity may be obtained from the spectrometer 210 for the formation of a "regular" bright-field image. Either simultaneously or separately, the location of the secondary electron peak (somewhere around a few electron-volts) may be detected as a direct measure of the local surface potential. This measurement may then be continuously fed back into the column control system to automatically maintain the image focus or to cancel any energy spectrum drift due to charging.

Figure 4A:
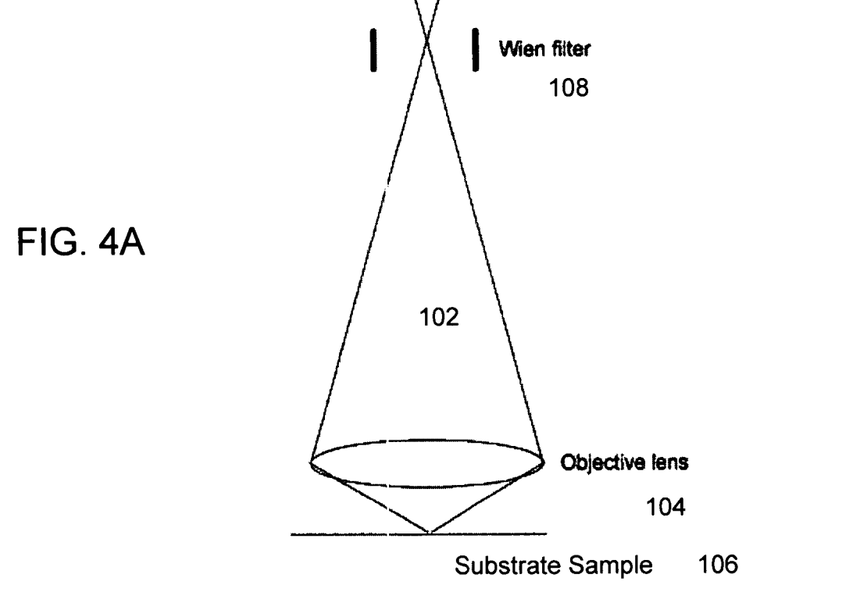
FIG. 4A is a schematic diagram depicting a high numerical aperture (NA) primary electron beam with a cross-over near a center of a Wien filter which is positioned relatively high above the objective lens in accordance with an embodiment of the invention.
Figure 4B:
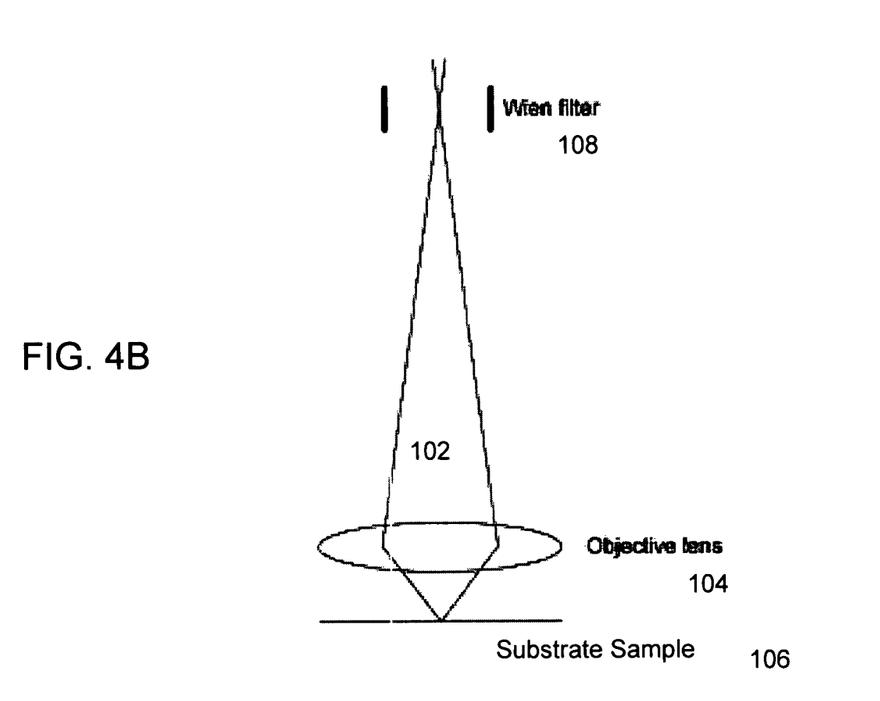
FIG. 4B is a schematic diagram depicting a low NA primary electron beam with a cross-over near the center of the Wien filter which is positioned relatively high above the objective lens in accordance with an embodiment of the invention.

As discussed previously, the on-axis embodiment of FIG. 3 includes positioning of the Wien filter 108 higher up in the column above the objective lens 104. This higher-up location gives more energy dispersion and provides higher energy resolution. In this case, as shown in FIGS. 4A and 4B, a crossover of the primary beam 102 may be advantageously positioned in or near a center of the Wien filter 108 to minimize aberrations in the final probe impinging upon the substrate surface.

With that crossover condition, the numerical aperture of the objective lens 104 may be controlled by condenser lenses (not shown) positioned above the Wien filter 108 in the electron beam column, wherein the condenser lenses are controlled in such a way that the crossover position and objective lens excitations are constant or nearly constant. FIG. 4A is a schematic diagram depicting a high numerical aperture (NA) primary electron beam 102 with a cross-over near a center of a Wien filter 108 which is positioned relatively high above the immersion objective lens 104 in accordance with an embodiment of the invention. Similarly, FIG. 4B is a schematic diagram depicting a low NA primary electron beam 102 with a cross-over near the center of the Wien filter 108 which is positioned relatively high above the immersion objective lens 104 in accordance with an embodiment of the invention.

Figure 5:
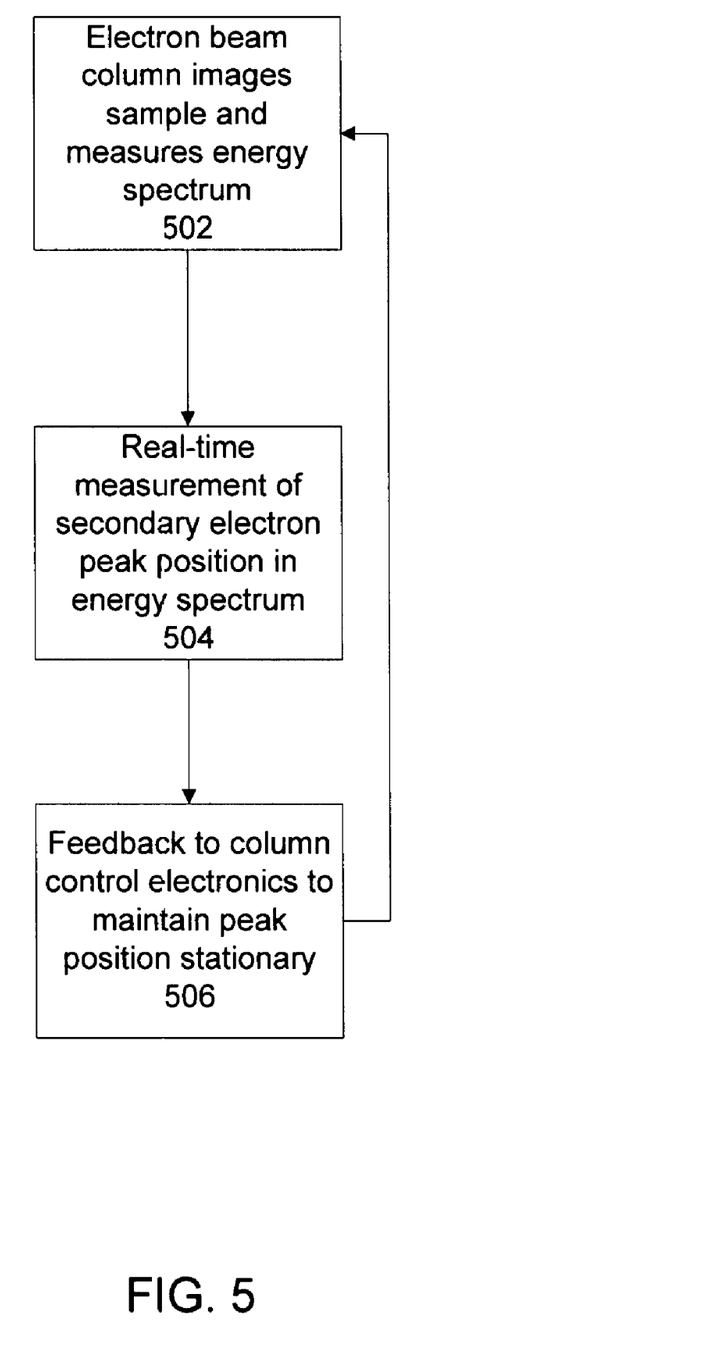
FIG. 5 is a flow chart depicting a method of maintaining an electron energy spectrum relatively stationary using feedback of a secondary electron peak position to column control electronics in accordance with an embodiment of the invention.

FIG. 5 is a flow chart depicting a method of maintaining an electron energy spectrum relatively stationary using feedback of a secondary electron peak position to column control electronics in accordance with an embodiment of the invention. The electron beam column is used to image the sample and also to measure the energy spectrum (step 502). This may be accomplished using the apparatus and methods discussed above. A real-time measurement or determination may be made of a secondary electron peak position in the measured energy spectrum (step 504). That peak position may then be fed back to the control electronics for the electron beam column, and the control electronics may then adjust the control parameters of the electron beam so as to counteract surface charging and maintain the peak position stationary (step 506).

The above-described diagrams are not necessarily to scale and are intended be illustrative and not limiting to a particular implementation. Specific dimensions, geometries, and lens currents of the immersion objective lens will vary and depend on each implementation.

The above-described invention may be used in an automatic inspection system and applied to the inspection of wafers, X-ray masks and similar substrates in a production environment. While it is expected that the predominant use of the invention will be for the inspection of wafers, optical masks, X-ray masks, electron-beam-proximity masks and stencil masks, the techniques disclosed here may be applicable to the high speed electron beam imaging of any material (including perhaps biological samples).

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention sire described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An electron beam apparatus comprising:
   an electron beam column configured to generate a primary electron beam along an optical axis of the column;
   an immersion objective lens configured to focus the primary electron beam onto a substrate sample and to immerse the substrate sample in a magnetic field;
   a Wien filter configured to deflect a secondary electron beam away from the optical axis and to introduce an energy dispersion in the deflected secondary electron beam;
   a bright-field/dark-field detector comprising an opening configured to pass through bright-field secondary electrons and one or more detector segments around the opening configured to detect dark field secondary electrons; and
   an electron energy spectrometer configured to detect the bright-field secondary electrons passed through the opening and to measure an energy spectrum of the bright-field secondary electrons.

2. The apparatus of claim 1, wherein the bright-field/dark-field detector comprises an off-axis detector, and further wherein the Wien filter is positioned lower in the column above the objective lens so as to deflect the secondary electron beam towards the bright-field/dark-field detector.

3. The apparatus of claim 1, wherein the bright-field/dark-field detector comprises an on-axis detector, and further wherein the Wien filter is positioned higher in the column above the bright-field/dark-field detector so as to deflect the bright field secondary electrons away from the optical axis and towards the electron energy spectrometer.

4. The apparatus of claim 3, wherein the primary electron beam is configured such that a crossover in the primary electron beam is positioned near a center of the Wien filter.

5. The apparatus of claim 4, wherein a numerical aperture of the objective lens is controlled by condenser lenses positioned above the Wien filter in the electron beam column.

6. The apparatus of claim 1, further comprising a focusing electron lens positioned to focus the secondary electron beam prior to the bright-field/dark-field detector.

7. The apparatus of claim 1, further comprising a deflector that is controllable so as to deflect the bright-field secondary electrons to either the spectrometer or to a bright-field imaging detector.

8. The apparatus of claim 7, further comprising focusing electron lenses which are controllably adjusted depending upon whether the bright-field secondary electrons are being deflected to the spectrometer or to a bright-field imaging detector.

9. A method of electron beam imaging and spectrometry, the method comprising:
   generating a primary electron beam along an optical axis of an electron beam column;
   focusing the primary electron beam onto the substrate sample and immersing the substrate sample in a magnetic field;
   deflecting a secondary electron beam away from the optical axis and introducing an energy dispersion in the deflected secondary electron beam;
   detecting dark field secondary electrons while bright field secondary electrons are passed through an opening; and
   detecting the bright field secondary electrons passed through the opening.

10. The method of claim 9, further comprising measuring an electron energy spectrum of the bright field secondary electrons.

11. The method of claim 9, wherein the secondary electron beam is deflected away from the optical axis prior to the dark field secondary electrons being detected.

12. The method of claim 9, wherein the dark field secondary electrons are detected prior to the secondary electron beam being deflected away from the optical axis.

13. The method of claim 9, wherein a Wien filter performs the deflection of the secondary electron beam away from the optical axis and further introduces the energy dispersion.

14. The method of claim 13, wherein the primary electron beam is configured such that a crossover in the primary electron beam is positioned near a center of a Wien filter.

15. The method of claim 14, further comprising controlling a numerical aperture by condenser lenses positioned above the Wien filter in the electron beam column.

16. The method of claim 10, further comprising controllably deflecting the bright-field secondary electrons either to the spectrometer or to a bright-field imaging detector.

17. The method of claim 16, further comprising controllably adjusting focusing electron lenses depending upon whether the bright-field secondary electrons are being deflected to the spectrometer or to a bright-field imaging detector.

18. The method of claim 10, further comprising deflecting the bright field secondary electrons for alignment with an electron energy spectrometer.

19. The method of claim 10, further comprising using a peak position in the electron energy spectrum as a feedback signal to column control electronics.

20. An apparatus for detecting bright-field and dark-field secondary electrons and for measuring an energy spectrum of the bright-field electrons, the apparatus comprising:
   a bore hole configured to pass through the bright-field secondary electrons; one or more detector segments around the opening configured to detect the dark-field secondary electrons; and
   an electron energy spectrometer configured to detect the bright-field secondary electrons passed through the opening and to measure an energy spectrum of the bright-field secondary electrons.

21. A method of electron beam imaging and spectrometry, the method comprising: generating a primary electron beam along an optical axis of an electron beam column; focusing the primary electron beam onto the substrate sample and immersing the substrate sample in a magnetic field; deflecting a secondary electron beam away from the optical and introducing an energy dispersion in the deflected secondary electron beam, wherein said deflecting alternates rapidly between a first off-axis direction or a second off-axis direction; detecting bright-field and dark-field secondary electrons when the secondary electron beam is deflected in the first off-axis direction; wherein the bright-field/dark-field detector comprising an opening configured to pass through bright-field secondary electrons and one or more detector segments around the opening configured to detect dark field secondary electrons; and detecting an electron energy spectrum when the secondary electron beam is deflected in the second off-axis direction.

22. The method of claim 21, wherein said deflecting is performed by a Wien filter, and further wherein changing between the first and second off-axis directions is accomplished by switching polarity of the Wien filter.

* * * * *